(12) United States Patent
Hsieh et al.

(10) Patent No.: US 9,890,246 B2
(45) Date of Patent: Feb. 13, 2018

(54) FLUORENYLIDENE-DIPHENOL-CONTAINING POLYPHENYLENE OXIDE

(71) Applicant: Elite Electronic Material (KunShan) Co., Ltd., Kunshan, Jiangsu Province (CN)

(72) Inventors: Chen Yu Hsieh, Taoyuan (TW); Yan Zhang, Kunshan (CN)

(73) Assignee: Elite Electronic Material (Kunshan) Co., Ltd., Kunshan, Jiangsu Province (CN)

( * ) Notice: Subject to any disclaimer, the term of this patent is extended or adjusted under 35 U.S.C. 154(b) by 69 days.

(21) Appl. No.: 15/220,934

(22) Filed: Jul. 27, 2016

(65) Prior Publication Data

US 2017/0174835 A1    Jun. 22, 2017

(30) Foreign Application Priority Data

Dec. 18, 2015  (CN) .......................... 2015 1 0957740

(51) Int. Cl.
| | | |
|---|---|---|
| *C08G 65/48* | (2006.01) | |
| *C08L 71/12* | (2006.01) | |
| *C08J 5/24* | (2006.01) | |
| *C08K 5/53* | (2006.01) | |
| *C09D 171/02* | (2006.01) | |
| *H05K 1/03* | (2006.01) | |
| *C09D 171/12* | (2006.01) | |

(52) U.S. Cl.
CPC .............. *C08G 65/485* (2013.01); *C08J 5/24* (2013.01); *C08K 5/53* (2013.01); *C08L 71/126* (2013.01); *C09D 171/02* (2013.01); *C09D 171/12* (2013.01); *H05K 1/0373* (2013.01); *C08J 2371/12* (2013.01)

(58) Field of Classification Search
CPC ...... C08G 65/48; C08G 65/485; C08L 71/126
See application file for complete search history.

(56) References Cited

U.S. PATENT DOCUMENTS

| | | | | | |
|---|---|---|---|---|---|
| 3,761,449 | A | * | 9/1973 | Kaufman | C08G 65/4006 528/171 |
| 5,691,442 | A | * | 11/1997 | Unroe | C08G 65/4006 528/125 |
| 9,447,238 | B2 | * | 9/2016 | Gao | C08L 71/126 |
| 2005/0090624 | A1 | * | 4/2005 | Norisue | C07C 41/16 525/392 |
| 2008/0154006 | A1 | * | 6/2008 | Amagai | C08G 59/063 526/317.1 |
| 2009/0004488 | A1 | * | 1/2009 | Park | C08G 65/485 428/458 |
| 2009/0062478 | A1 | * | 3/2009 | Carrillo | C08G 65/44 525/397 |

* cited by examiner

*Primary Examiner* — Brieann R Johnston
(74) *Attorney, Agent, or Firm* — Muncy, Geissler, Olds & Lowe, P.C.

(57) ABSTRACT

Disclosed is a fluorenylidene-diphenol-containing polyphenylene oxide which is defined by the following structural formula

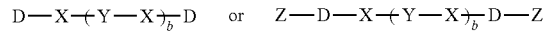

wherein D, X, Y, Z and b are defined in the specification. The fluorenylidene-diphenol-modified polyphenylene oxide resin or its prepolymer may be used for producing resin products with better thermal resistance, dielectric property, flame retardancy and lower thermal expansion. Accordingly, the resin products, such as prepregs, laminates or printed circuit boards, are suitable for use in electronic products with high speed and high frequency signal transmission to further improve the reliability, thermal resistance, and dimensional stability of the electronic products.

11 Claims, 1 Drawing Sheet

FLUORENYLIDENE-DIPHENOL-CONTAINING POLYPHENYLENE OXIDE

CROSS-REFERENCE TO RELATED APPLICATIONS

This application claims priority of China Patent Application No. 201510957740.9, filed on Dec. 18, 2015, the entirety of which is incorporated by reference herein.

BACKGROUND OF THE INVENTION

Field of the Invention

The present disclosure relates to a polyphenylene oxide resin and more particularly to a fluorenylidene-diphenol-containing polyphenylene oxide.

Description of Related Art

With the rapid advancement of electronic technology, information processing in mobile communication, servers, cloud storage and other electronic products has incessantly directed toward high frequency signal transmission and high speed digitalization, and low dielectric resin material has become the mainstream for the development of laminates for high frequency and high speed data transmission in order to satisfy the demands of high speed information transmission. Major criteria of copper clad laminates (CCLs) include low dielectric constant (Dk), low dissipation factor (Df), high reliability, high moisture/thermal resistance and high dimensional stability of the material. Therefore, there is a need for satisfactory materials of a high performance printed circuit board (PCB).

Compared with other resin materials, polyphenylene oxide (PPO) resin, also known as polyphenylene ether (PPE) resin, has the advantages of low dielectric constant and low dissipation factor, making it an ideal material for a high frequency PCB.

However, conventional PPOs, such as dihydroxy PPO and bis(vinylbenzyl) PPO, still fail to meet the need in use, such as one or more unsatisfactory properties including flame retardancy, thermal resistance, dielectric constant, dissipation factor, toughness, reactivity, viscosity and solubility. Therefore, there is a need for an improved PPO to meet the demands in production process and product properties.

SUMMARY OF THE INVENTION

A first aspect of the present disclosure provides a fluorenylidene-diphenol-modified polyphenylene oxide, having any one of the following formulae:

wherein X is selected from:

and a combination thereof, and wherein $R_{24}$ are individually selected from C1 to C4 alkylene; Y is selected from:

wherein A is a covalent bond, $-CH_2-$, $-CH(CH_3)-$, $-C(CH_3)_2-$, $-O-$, $-S-$, $-SO_2-$ or a carbonyl group; m and n are the same or different positive integers; $R_1$ to $R_{16}$ are individually selected from hydrogen and a C1 to C4 alkyl;

Z is selected from:

and a combination thereof;

wherein $R_{17}$ through $R_{23}$ are individually hydrogen or a C1 to C4 alkyl; Q and W are individually an aliphatic group;

D is selected from:

and a combination thereof;
wherein R is hydrogen or a covalent bond; and
b is a positive integer of 1 to 20.

In one embodiment, b is a positive integer of 1 to 5.
In one embodiment, b is 1.
In one embodiment, m and n are individually a positive integer of 1 to 30.
In one embodiment, m and n are individually a positive integer of 1 to 10.
In one embodiment, m and n are individually a positive integer of 1 to 6.
In one embodiment, $R_2$, $R_3$, $R_7$, $R_8$, $R_{10}$, $R_{11}$, $R_{15}$ and $R_{16}$ are individually methyl, $R_1$, $R_4$, $R_5$, $R_6$, $R_9$, $R_{12}$, $R_{13}$ and $R_{14}$ are individually hydrogen, and A is —C(CH$_3$)$_2$—.
In one embodiment, $R_1$, $R_2$, $R_3$, $R_6$, $R_7$, $R_8$, $R_{10}$, $R_{11}$, $R_{15}$ and $R_{16}$ are individually methyl, $R_4$, $R_5$, $R_9$, $R_{12}$, $R_{13}$ and $R_{14}$ are individually hydrogen, and A is a covalent bond.
In one embodiment, W is a C1 to C3 aliphatic group, such as an alkylene with 1 to 3 carbon atoms.
In one embodiment, W is —CH$_2$—.
In one embodiment, Z is:

In one embodiment, Q is a C1 to C3 aliphatic group, such as an alkyl group with 1 to 3 carbon atoms.
In one embodiment, Z is 2-propenyl.
In one embodiment, Y is selected from:

and a combination thereof.
In one embodiment, the fluorenylidene-diphenol-modified polyphenylene oxide is selected from:

and/or wherein m and n are individually an integer of 1 to 10.

A second aspect of the present disclosure provides a fluorenylidene-diphenol-modified polyphenylene oxide resin preparation method, comprising:

(1) reacting a bis(chloromethyl) compound with a dihydroxy polyphenylene oxide to obtain a first intermediate; and (2) reacting the first intermediate with a fluorenylidene-diphenol to obtain the fluorenylidene-diphenol-modified polyphenylene oxide resin.

In one embodiment, the step of reacting a bis(chloromethyl) compound with a dihydroxy polyphenylene oxide comprises reacting the bis(chloromethyl) compound and the dihydroxy polyphenylene oxide in the presence of a phase transfer catalyst to obtain the first intermediate.

In one embodiment, the step of reacting the first intermediate with a fluorenylidene-diphenol comprises reacting the first intermediate with the fluorenylidene-diphenol in an alkaline environment to obtain the fluorenylidene-diphenol-modified polyphenylene oxide resin.

In one embodiment, the method comprises:

at 60° C. to 90° C., mixing the bis(chloromethyl) compound, the dihydroxy polyphenylene oxide, the phase transfer catalyst and a solvent and stirring until obtaining a fully dissolved first mixture solution;

heating the first mixture solution to 85° C. to 110° C. and stirring for 4 hours to 8 hours to obtain a solution of the first intermediate;

adding alkali metal hydroxide and water to the solution of the first intermediate, and at a temperature controlled at 85° C. to 110° C., stirring for 4 hours to 8 hours to obtain an alkaline solution;

cooling the alkaline solution to 60° C. to 80° C. to obtain a cooled solution, mixing the fluorenylidene-diphenol with the cooled solution, and stirring for 2 hours to 6 hours to obtain a solution of a second intermediate; and cooling the solution of the second intermediate to room temperature, adding an acidic solution to neutralize the solution of the second intermediate, stirring with water addition and removing waste liquid, and removing the solvent to obtain a hydroxy-terminated fluorenylidene-diphenol-modified polyphenylene oxide resin.

In one embodiment, the method further comprises mixing the second intermediate with a vinyl compound, the phase transfer catalyst and the solvent, stirring until fully dissolved and further stirring for 2 hours to 6 hours to obtain a solution of a third intermediate.

In one embodiment, the method further comprises cooling the solution of the third intermediate to room temperature, adding an acidic solution to neutralize the third intermediate, stirring with water addition and removing waste liquid, and removing the solvent to obtain a vinyl-terminated fluorenylidene-diphenol-modified polyphenylene oxide resin.

A third aspect of the present disclosure provides a resin composition which comprises the aforesaid fluorenylidene-diphenol-modified polyphenylene oxide.

In one embodiment, the resin composition comprises:

100 parts by weight of the aforesaid fluorenylidene-diphenol-modified polyphenylene oxide resin; and 15 to 80 parts by weight of a flame retardant, which has the following structure:

In one embodiment, the resin composition further comprises at least one of a secondary flame retardant, inorganic filler, curing accelerator, solvent, surfactant and crosslinking agent.

In one embodiment, the resin composition further comprises a vinyl compound and/or a vinyl polymer.

In one embodiment, the vinyl compound and/or vinyl polymer is ethylene-propylene-diene monomer rubber, butadiene-styrene copolymer, bismaleimide or a combination thereof.

In one embodiment, the resin composition comprises 5 to 50 parts by weight of butadiene-styrene copolymer; and/or 14 to 50 parts by weight of bismaleimide.

A fourth aspect of the present disclosure provides a product made from the aforesaid resin composition, comprising a resin film, a prepreg, a laminate or a printed circuit board.

The present disclosure further provides a use of fluorenylidene-diphenol in the preparation of a polyphenylene oxide resin or in the modification of a polyphenylene oxide.

DETAILED DESCRIPTION OF THE EMBODIMENTS

Fluorenylidene-Diphenol-Modified Polyphenylene Oxide

The fluorenylidene-diphenol-modified polyphenylene oxide of the present disclosure generally has any one of the following structures:

Generally, in the fluorenylidene-diphenol-modified polyphenylene oxide, X is selected from:

and a combination thereof, wherein $R_{24}$ are individually selected from C1 to C4 alkylene, such as methylene or ethylene, preferably methylene.

More preferably, X is:

Generally, in the fluorenylidene-diphenol-modified polyphenylene oxide, Y is selected from:

wherein A is a covalent bond, $-CH_2-$, $-CH(CH_3)-$, $-C(CH_3)_2-$, $-O-$, $-S-$, $-SO_2-$ or a carbonyl group; m and n may be the same or different positive integers; $R_1$-$R_{16}$ are individually selected from hydrogen and a C1 to C4 alkyl.

Preferably, A is a covalent bond or $-C(CH_3)_2-$; $R_1$-$R_{16}$ are individually selected from hydrogen or methyl group. More preferably, $R_2$, $R_3$, $R_7$, $R_8$, $R_{10}$, $R_{11}$, $R_{15}$ and $R_{16}$ are individually a methyl group, $R_1$, $R_4$, $R_5$, $R_6$, $R_9$, $R_{12}$, $R_{13}$ and $R_{14}$ are individually hydrogen, and A is —C(CH$_3$)$_2$—; alternatively, $R_1$, $R_2$, $R_3$, $R_6$, $R_7$, $R_8$, $R_{10}$, $R_{11}$, $R_{15}$ and $R_{16}$ are individually a methyl group, $R_4$, $R_5$, $R_9$, $R_{12}$, $R_{13}$ and $R_{14}$ are individually hydrogen, and A is a covalent bond.

m and n are preferably a positive integer of 1 to 30, more preferably a positive integer of 1 to 10, and even more preferably a positive integer of 1 to 6.

In a preferred embodiment, Y is:

wherein m and n are individually an integer of 1 to 10, preferably an integer of 1 to 6.

Generally, in the fluorenylidene-diphenol-modified polyphenylene oxide, Z is selected from:

and a combination thereof, wherein $R_{17}$ to $R_{23}$ are individually hydrogen or C1 to C4 alkyl; and Q and W are individually an aliphatic group.

W and Q are individually a C1 to C3 aliphatic group, preferably a C1 to C3 alkylene, such as methylene. Preferably, $R_{17}$ to $R_{23}$ are individually hydrogen.

Therefore, in a preferred embodiment, Z is:

In one embodiment, the vinyl group of Z is located at the para-position, i.e. position 4.

In other preferred embodiments, Z may be 2-propenyl, Q is —CH$_2$—, and $R_{21}$ to $R_{23}$ are individually H.

Generally, in the fluorenylidene-diphenol-modified polyphenylene oxide, D is the fluorenylidene-diphenol portion, which may be selected from:

and a combination thereof, wherein R is H or a covalent bond.

It is understood that D is linked to X via the "—O—" structure.

In a preferred embodiment, D is:

In the fluorenylidene-diphenol-modified polyphenylene oxide, b is a positive integer of 1 to 20, preferably a positive integer of 1 to 5, more preferably 1.

Method of Preparing Fluorenylidene-Diphenol-Modified Polyphenylene Oxide

The fluorenylidene-diphenol-modified polyphenylene oxide resin according to the present disclosure may be prepared by the following method, comprising:

(1) reacting a bis(chloromethyl) compound with a dihydroxy polyphenylene oxide to obtain a first intermediate; and (2) reacting the first intermediate with a fluorenylidene-diphenol to obtain the fluorenylidene-diphenol-modified polyphenylene oxide resin.

In the present disclosure, a suitable bis(chloromethyl) compound may be selected from bis(chloromethyl)benzene, bis(chloromethyl)biphenyl, bis(chloromethylphenyl)ether and a combination thereof. It is understood that, in the fluorenylidene-diphenol-modified polyphenylene oxide resin of the present disclosure where $R_{24}$ of X is an alkylene other than methylene, such as a C2 to C4 alkylene, the bis(chloromethyl) compound may be replaced by a corresponding bis(chloroalkyl) compound. Similarly, the chlorine atom in the bis(chloromethyl) compound may be replaced by other halogen atoms, such as F or Br.

In the present disclosure, a suitable dihydroxy polyphenylene oxide may be any dihydroxy polyphenylene oxide useful for preparing the polyphenylene oxide resin. An example is the polyphenylene oxide with two terminals respectively bonded to a hydroxy group. The dihydroxy polyphenylene oxide suitable for the present disclosure is commercially available, such as, but not limited to, SA-90 available from Sabic, OPE available from Mitsubishi Gas Chemical Co., Inc. and a combination thereof.

The bis(chloromethyl) compound and the dihydroxy polyphenylene oxide may be reacted in the presence of a phase transfer catalyst. A suitable phase transfer catalyst may be selected from quaternary ammonium salt and tetra-butylphosphonium bromide, preferably quaternary ammonium salt, and more preferably tetra-n-butylammonium bromide. The reaction is generally carried out in solvent. Suitable solvent may be selected from dimethyl sulfoxide, dimethyl formamide, dimethyl acetamide, toluene, xylene and a combination thereof, preferably toluene.

Generally, step (1) includes: at 60° C. to 90° C., mixing the bis(chloromethyl) compound, the dihydroxy polyphenylene oxide, the phase transfer catalyst and the solvent, and stirring until obtaining a fully dissolved first mixture solution; then heating the first mixture solution to 85° C. to 110° C., and stirring for 4 hours to 8 hours to obtain a solution of the first intermediate.

The molar ratio of the bis(chloromethyl) compound to the dihydroxy polyphenylene oxide is generally between 3:1 and 1:3, which can be properly adjusted by a skilled person according to the type of the bis(chloromethyl) compound and the dihydroxy polyphenylene oxide, and the polyphenylene oxide resin to be prepared. The molar ratio of the phase transfer catalyst to the dihydroxy polyphenylene oxide is generally between 1:1 and 1:10, and the amount of solvent is generally 1 to 5 times of the mass of the dihydroxy polyphenylene oxide.

Step (2) is generally performed in an alkaline environment. Therefore, after obtaining the first intermediate solution, the pH value of the solution is adjusted to 8 to 12, and it is reacted with the fluorenylidene-diphenol. pH adjustment of the first intermediate solution can be done by any technical means known in the art, such as by adding alkali metal hydroxide to the solution, such as sodium hydroxide or potassium hydroxide. Water can be added at the same time if needed, so as to adjust the pH to a desirable range. During pH adjustment, the temperature of the solution is generally controlled at 85° C. to 110° C. with stirring for 4 hours to 8 hours to obtain an alkaline solution.

After that, the alkaline solution is cooled to 60° C. to 80° C. to obtain a cooled solution, which is mixed with the fluorenylidene-diphenol and stirred for 2 hours to 6 hours to obtain the second intermediate solution. Generally, the molar ratio of the first intermediate to fluorenylidene-diphenol is 1:4 to 4:1.

A suitable fluorenylidene-diphenol compound according to the present disclosure comprises but not limited to those listed below:

Next, the second intermediate solution may be cooled to room temperature, followed by adding an acidic solution to neutralize the second intermediate solution, adjusting the pH to 6 to 8, stirring with water addition and removing waste liquid, and being subjected to reduced pressure distillation to remove solvent so as to obtain the fluorenylidene-diphenol-modified polyphenylene oxide resin. The fluorenylidene-diphenol-modified polyphenylene oxide resin thus made has a structure below:

which is a hydroxy-terminated fluorenylidene-diphenol polyphenylene oxide resin.

Furthermore, before adding the acidic solution, the second intermediate, i.e. hydroxy-terminated fluorenylidene-diphenol polyphenylene oxide resin, can be mixed with the vinyl compound, the phase transfer catalyst and the solvent, followed by stirring until fully dissolved and further stirring for 2 hours to 6 hours to obtain a third intermediate solution, which is cooled to room temperature, added with an acidic solution to neutralize the third intermediate, followed by stirring with water addition and removing the waste liquid and being subjected to reduced pressure distillation to remove solvent so as to obtain the fluorenylidene-diphenol-modified polyphenylene oxide resin. The fluorenylidene-diphenol-modified polyphenylene oxide resin thus made is a vinyl-terminated fluorenylidene-diphenol-modified polyphenylene oxide resin, having a structure below:

The vinyl compound may be a vinyl chloride compound, such as any aromatic or aliphatic compound containing a vinyl group and a chloro group. A suitable vinyl compound comprises 4-chloromethylstyrene, 3-chloromethyl styrene, 2-chloromethylstyrene, methacrylic acid, allyl chloride and a combination thereof. Preferably, the vinyl compound is 4-chloromethylstyrene, 3-chloromethylstyrene or 2-chloromethylstyrene. The phase transfer catalyst and the solvent are the same as described above.

The acidic solution suitable for the present disclosure may be phosphoric acid, hydrochloric acid, sulfuric acid or acetic acid; preferably, the acidic solution is phosphoric acid.

Generally, to the second intermediate solution thus made is added 0.1 mole to 4 moles of a vinyl compound and 0.01 mole to 1 mole of a phase transfer catalyst, dissolved in the solvent and mixed, to obtain the third intermediate solution; wherein the solvent accounts for 30 wt % to 70 wt % of the total third intermediate solution. The use amount of the vinyl compound and phase transfer catalyst can be determined according to the second intermediate solution actually obtained. For example, generally, the molar ratio of the second intermediate to the vinyl compound may be 1:10 to 10:1, and the molar ratio of the second intermediate to the phase transfer catalyst may be 1:1 to 10:1.

Resin Composition

The present disclosure provides a resin composition containing the aforesaid fluorenylidene-diphenol-modified polyphenylene oxide.

In one embodiment, the resin composition comprises 100 parts by weight of the fluorenylidene-diphenol-modified polyphenylene oxide resin and 15 to 80 parts by weight of a flame retardant, which has the structure below ("Flame Retardant A"):

The use amount of Flame Retardant A is preferably 15 to 60 parts by weight and more preferably 20 to 50 parts by weight.

The resin composition further comprises a vinyl compound and/or a vinyl polymer. The vinyl compound and/or vinyl polymer may be selected from ethylene-propylene-diene monomer rubber, butadiene-styrene copolymer, bismaleimide and a combination thereof.

Preferably, the resin composition according to the present disclosure contains 5 to 50 parts by weight of a butadiene-styrene copolymer; and/or 14 to 50 parts by weight of bismaleimide.

The fluorenylidene-diphenol-modified polyphenylene oxide resin composition according to the present disclosure may further comprise any one or more of inorganic filler, curing accelerator, solvent, surfactant, and crosslinking agent.

The resin composition according to the present disclosure may further comprise a secondary flame retardant in addition to Flame Retardant A. The secondary flame retardant comprises but not limited to a compound with flame retardant elements or flame retardant functional groups, such as a phosphorous-containing compound, a nitrogen-containing compound or a bromine-containing compound. The phosphorous-containing compound may be at least one of the following compounds, but not limited thereto: bisphenol diphenyl phosphate, ammonium polyphosphate, hydroquinone bis-(diphenyl phosphate), bisphenol A bis-(diphenyl-phosphate), tri(2-carboxyethyl)phosphine (TCEP), tri(chloroisopropyl) phosphate, trimethyl phosphate (TMP), dimethyl methyl phosphonate (DMMP), resorcinol bis(dixylenyl phosphate) (RDXP, such as PX-200, commercially available from Daihachi Chemical Industry Co. Ltd.), 4,4'-biphenyl bis(phosphodiesterase-(2,6-dimethylphenyl)ester) (such as PX-202, commercially available from Daihachi Chemical Industry Co. Ltd.), phosphazene (such as SPB-100, commercially available from Otsuka Chemical Co. Ltd.), m-phenylene methylphosphonate (PMP), melamine polyphosphate, 9, 10-dihydro-9-oxa-10-phosphaphenan-threne-10-oxide (DOPO), DOPO-containing epoxy resin, DOPO-HQ-containing epoxy resin, diphenyl phosphine oxide (DPPO) compound, diphenylphosphine oxide derivatives, DOPO-containing phenolic resin, e.g. DOPO-HQ, DOPO-containing phenolic novolac (DOPO-PN) resin and DOPO-containing bisphenol novolac (DOPO-BPN) resin, wherein DOPO-BPN resin may be bisphenol novolac resin such as DOPO-containing bisphenol A novolac (DOPO-BPAN), DOPO-containing bisphenol F novolac (DOPO-BPFN), and DOPO-containing bisphenol S novolac (DOPO-BPSN), etc. The nitrogen-containing compound may be selected from amino triazine novolac (ATN), melamine cyanurate, trihydroxy ethyl isocyanurate, and a combination thereof. The bromine-containing compound may be at least one of the following compounds, but not limited thereto: tetrabromobisphenol A (TBBPA), tetrabromocyclohexane, hexabromocyclodecane, 2,4,6-tris(tribromophenoxy)-1,3,5-triazine and decabromodiphenyl ethane (DBDPE).

Preferably, to per 100 parts by weight of fluorenylidene-diphenol-modified polyphenylene oxide, the amount of the secondary flame retardant is 10 to 90 parts by weight.

Inorganic fillers suitable for the present disclosure may be any inorganic filler known in the art useful for the polyphenylene oxide resin and may comprise without limitation silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride, calcined kaolin or a combination thereof. Preferably, the inorganic filler may be spherical, fibrous, plate-like, particulate, sheet-like or whisker-like and can be optionally pretreated by a silane coupling agent, such as silane or siloxane compound. Preferably, the inorganic filler has a particle size of 100 μm or less, preferably 1 nm to 20 μm; more preferably, the inorganic filler is nano-scaled, having a particle size between 1 nm to 1 μm.

To per 100 parts by weight of the aforesaid fluorenylidene-diphenol-modified polyphenylene oxide, the use amount of the inorganic filler may be 50 to 100 parts by weight, generally 50 to 80 parts by weight.

Curing accelerators suitable for the present disclosure may be any known curing accelerator useful for preparing resins, particularly polyphenylene oxide resins, and may comprise without limitation catalysts such as a Lewis base or a Lewis acid, wherein the Lewis base may comprise any one or more of imidazole, boron trifluoride-amine complex, ethyltriphenyl phosphonium chloride, 2-methylimidazole (2MI), 2-phenylimidazole (2PZ), 2-ethyl-4-methylimidazole (2E4MI), triphenylphosphine (TPP) and 4-dimethylaminopyridine (DMAP), and the Lewis acid may comprise metal salt compounds, such as those of manganese, iron, cobalt, nickel, copper and zinc, such as zinc octanoate or cobalt octanoate as metal catalyst. Preferably, the curing accelerator comprises a peroxide capable of producing free radicals, including but not limited to dicumyl peroxide, tert-butyl peroxybenzoate, and di(tert-butylperoxyisopropyl)benzene, wherein di(tert-butylperoxyisopropyl)benzene is more preferred. To per 100 parts by weight of the aforesaid fluorenylidene-diphenol-modified polyphenylene oxide, the use amount of the curing accelerator may be 0.5 to 5 parts by weight.

Solvents suitable for the present disclosure may be any known solvent useful for preparing resins, particularly polyphenylene oxide resins, and may comprise without limitation methanol, ethanol, ethylene glycol monomethyl ether, acetone, butanone (methyl ethyl ketone), methyl isobutyl ketone, cyclohexanone, toluene, xylene, methoxy ethyl acetate, ethoxy ethyl acetate, propoxyethyl acetate, ethyl acetate, dimethyl formamide, propylene glycol methyl ether, or a mixture thereof. To per 100 parts by weight of the aforesaid fluorenylidene-diphenol-modified polyphenylene oxide, the use amount of the solvent may be 50 to 150 parts by weight, such as 60 to 130 parts by weight or 80 to 150 parts by weight.

Surfactants suitable for the present disclosure may be any known surfactant useful for preparing resins, particularly polyphenylene oxide resins, and may comprise without limitation silane compounds or siloxane compounds. To per 100 parts by weight of the aforesaid fluorenylidene-diphenol-modified polyphenylene oxide, the use amount of the surfactant may be 0.1 to 10 parts by weight.

Crosslinking agents suitable for the present disclosure may be any known crosslinking agent useful for preparing resins, particularly polyphenylene oxide resins, and may comprise without limitation olefin polymer, cyanate, isocyanate, cyanurate, isocyanurate, maleimide, toughener or a combination thereof Resin Product A fourth aspect of the present disclosure provides a resin product. Specifically, the resin product may be a prepreg, which comprises a reinforcement material and the abovementioned resin composition adhered onto the reinforcement material after impregnation and heated at high temperature to a semi-cured state. A baking temperature for making a prepreg is between 80° C. and 170° C.

The reinforcement material may be fiber material, woven fabric, and non-woven fabric, such as a fiberglass fabric, which is useful for increasing the mechanical strength of the prepreg. Preferably, the reinforcement material may be optionally pre-treated by a saline coupling agent. The resin product may also be a resin film, which is obtained by curing the resin composition such as by baking and heating. The resin composition can be selectively coated on a polyethylene terephthalate film (PET film), a polyimide film (PI film) or a resin coated copper (RCC), followed by baking and heating to cure the resin composition so as to form the resin film.

The resin product may also be a laminate, which comprises two metal foils and an insulation layer arranged between the metal foils. The insulation layer may be formed by subjecting the resin composition to a high temperature (150 to 230° C.) and high pressure (200 to 450 psi) condition to cure it. The insulation layer may be the aforesaid prepreg or resin film. The metal foil may comprise copper, aluminum, nickel, platinum, silver, gold or an alloy thereof. Copper foil is an example of the metal foil.

Preferably, the laminate is a copper clad laminate (CCL). Preferably, the laminate may be subject to trace formation processes to provide a printed circuit board.

The resin product made by using the fluorenylidene-diphenol-modified polyphenylene oxide resin or its prepolymer according to the present disclosure may ensure better thermal resistance (Tg, T288, S/D), dielectric property (Dk, Df), flame retardancy and lower thermal expansion. Accordingly the resin product, such as prepreg, laminate or printed circuit board, is suitable for use in electronic products for high speed and high frequency signal transmission to further improve the reliability, thermal resistance and dimensional stability of the electronic products.

Thus, the present disclosure also provides a process or use of preparing a polyphenylene oxide resin or modifying a polyphenylene oxide, characterized by using a fluorenylidene-diphenol.

The present disclosure is further described in conjunction with the embodiments and examples below. It is understood that these embodiments and examples are merely exemplary without limiting the scope of the present disclosure. Methods, reagents and conditions employed therein, unless specified otherwise, are known to those skilled in the art.

EXAMPLES

Chemical reagents used in the examples and comparative examples are listed below.
1. SA-9000: methacrylate-terminated bisphenol A polyphenylene oxide resin, available from Sabic
2. OPE-2st 2200: vinylbenzyl-terminated biphenyl polyphenylene oxide, available from Mitsubishi Gas Chemical Co., Inc.
3. SPB-100: phosphazene, available from Otsuka Chemical Co., Ltd.
4. PX-202: 4,4'-biphenyl bis(phosphodiesterase-(2,6-dimethylphenyl)ester), available from Daihachi Chemical Industry Co. Ltd.
5. XZ92741: hydroxy-containing phosphorous flame retardant, available from Dow Chemical Company
6. Fluorenylidene-diphenol, available from Sigma-Aldrich
7. BMI-70: bis(3-ethyl-5-methyl-4-maleimide phenyl) methane, available from KI Chemical
8. 25B: 2,5-dimethyl-2,5-di(tert-butylperoxy)-3-hexyne, available from NOF Corp.
9. SC-2050 SV: silica, available from Adamtech
10. trilene 67: liquid state ethylene-propylene-diene monomer rubber, available from Lion Copolymer
11. Ricon 100: butadiene-styrene copolymer, available from Cray Valley
12. D-1118: butadiene-styrene copolymer, available from Kraton Polymers
13. SA-90: hydroxy-terminated bisphenol A polyphenylene oxide resin, available from Sabic
14. OPE: hydroxy-terminated biphenyl polyphenylene oxide, available from Mitsubishi Gas Chemical Co., Inc.

Synthesis Example 1

Add 0.2 mol (400 g) of dihydroxy bisphenol A polyphenylene oxide (SA-90), 0.4 mol (70 g) of α,α'-dichloro-p-xylene, 0.01 mol (3.39 g) of tetrabutylphosphonium bromide and 600 g of toluene into a stirred tank, heat to 75° C. and stir until fully dissolved and well mixed. After heating the well-mixed solution to 95° C., stir for 6 hours; add 1.125 mol (45 g) of sodium hydroxide and 33 g of deionized water, followed by stirring for 6 hours; cool the solution to 70° C., and then add 0.4 mol (140 g) of fluorenylidene-diphenol, followed by stirring for 4 hours, and then cool the reaction solution to room temperature.

After that, to the cooled reaction solution, add 0.09 mol (8.8 g) of phosphoric acid and 165 g of deionized water, then uniformly mix to allow neutralization, and stand still the solution to allow precipitation. Remove liquid solution other than the precipitate, add 330 g of deionized water and stir, and remove liquid solution other than the precipitate again to complete the first washing cycle. Repeat the washing cycle for three times, and then distill under reduced pressure to remove the solvent and obtain the product.

All prepared fluorenylidene-diphenol polyphenylene oxide resin is added with 0.35 mol (53.4 g) of p-chloromethylstyrene (p-CMS), 0.01 mol (3.39 g) of tetrabutylphosphonium bromide and 500 g of toluene, heated to 75° C., and stirred for 4 hours, followed by cooling the reaction solution to room temperature.

To the cooled reaction solution, add 0.09 mol (8.8 g) of phosphoric acid and 165 g of deionized water for neutralization, stand still to allow layer separation, wherein the upper layer contains the solution and the lower layer contains the precipitate. Remove liquid solution other than the precipitate, further add 330 g of deionized water, stir, and remove liquid solution other than the precipitate again to complete the first washing cycle. Repeat the washing cycle for three times, and finally distill under reduced pressure to remove the solvent and obtain the product (Compound A).

Figure 1:
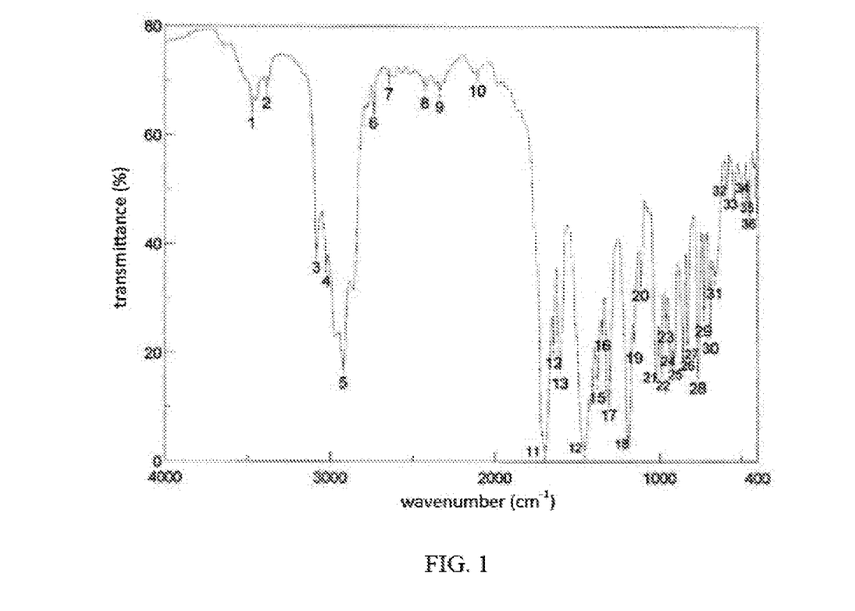
FIG. 1 illustrates the Fourier transform infrared spectroscopy (FTIR) result of a fluorenylidene-diphenol-modified polyphenylene oxide obtained by Synthesis Example 1.

Use Fourier transform infrared spectroscopy (FTIR) analysis to characterize the product thus obtained, and the result is shown in FIG. 1, wherein 3475.1 cm$^{-1}$ and 3386.39 cm$^{-1}$ represent stretching vibration absorption peaks of phenolic hydroxy (C—OH), 3082.65 cm$^{-1}$ and 3023.84 cm$^{-1}$ represent C—H stretching vibration absorption peaks of two fluorenylidene-diphenol benzene rings (C—H), 2920.66 cm$^{-1}$ is the methylene stretching vibration absorption peak (C—H), 1603.52 cm$^{-1}$ and 1455.99 cm$^{-1}$ are vibration characteristic absorption peaks of the benzene ring skeleton, 1187.94 cm$^{-1}$ is the C—O stretching vibration absorption peak (C—O) in fluorenylidene-diphenol, and 1020.16 cm$^{-1}$ is the stretching vibration absorption peak of C—O—C ether bond between fluorenylidene-diphenol and bis(chloromethyl)benzene (C—O—C). The FTIR result indicates the product thus obtained is a fluorenylidene-diphenol polyphenylene oxide resin shown below, wherein m is a positive integer of 1 to 10, and n is a positive integer of 1 to 10.

The position and intensity of each selected peak in FIG. 1 are listed below.

| # | position | intensity | # | position | intensity |
|---|----------|-----------|---|----------|-----------|
| 1 | 3475.1   | 65.2873   | 2 | 3386.39  | 68.9731   |
| 3 | 3082.65  | 38.7259   | 4 | 3023.84  | 36.2471   |

-continued

| # | position | intensity | # | position | intensity |
|---|----------|-----------|---|----------|-----------|
| 5 | 2920.66 | 17.5624 | 6 | 2735.53 | 65.3596 |
| 7 | 2642 | 70.7076 | 8 | 2426.98 | 69.0165 |
| 9 | 2337.3 | 68.3063 | 10 | 2105.89 | 71.2431 |
| 11 | 1697.05 | 1.6316 | 12 | 1644.98 | 21.3413 |
| 13 | 1603.52 | 17.5418 | 14 | 1455.99 | 2.04057 |
| 15 | 1376.93 | 14.9105 | 16 | 1348 | 24.583 |
| 17 | 1306.54 | 11.6861 | 18 | 1187.94 | 3.29631 |
| 19 | 1155.15 | 22.3274 | 20 | 1115.62 | 33.7372 |
| 21 | 1020.16 | 14.377 | 22 | 993.16 | 17.1074 |
| 23 | 960.377 | 26.1086 | 24 | 932.414 | 18.8454 |
| 25 | 911.201 | 18.9384 | 26 | 857.204 | 20.0668 |
| 27 | 829.241 | 21.395 | 28 | 766.566 | 16.7172 |
| 29 | 731.853 | 27.2087 | 30 | 693.284 | 24.1033 |
| 31 | 663.393 | 34.1616 | 32 | 590.111 | 50.0176 |
| 33 | 544.792 | 48.0793 | 34 | 492.723 | 49.6235 |
| 35 | 465.725 | 46.0419 | 36 | 449.333 | 46.3499 |

Synthesis Example 2

Add 0.2 mol (400 g) of dihydroxy biphenyl polyphenylene oxide (OPE), 0.4 mol (70 g) of α,α'-dichloro-p-xylene, 0.01 mol (3.39 g) of tetrabutylphosphonium bromide and 600 g of toluene into a stirred tank, heat to 75° C. and stir until fully dissolved and well mixed.

After heating the well-mixed solution to 95° C., stir for 6 hours; add 1.125 mol (45 g) of sodium hydroxide and 33 g of deionized water, followed by stirring for 6 hours; cool the solution to 70° C., and then add 0.4 mol (140 g) of fluorenylidene-diphenol, followed by stirring for 4 hours, and then cool the reaction solution to room temperature.

After that, to the cooled reaction solution, add 0.09 mol (8.8 g) of phosphoric acid and 165 g of deionized water, then uniformly mix to allow neutralization, and stand still the solution to allow precipitation. Remove liquid solution other than the precipitate, add 330 g of deionized water and stir, and remove liquid solution other than the precipitate again to complete the first washing cycle. Repeat the washing cycle for three times, and then distill under reduced pressure to remove the solvent and obtain the product.

All prepared fluorenylidene-diphenol polyphenylene oxide resin is added with 0.35 mol (53.4 g) of p-chloromethylstyrene (p-CMS), 0.01 mol (3.39 g) of tetrabutylphosphonium bromide and 500 g of toluene, heated to 75° C., and stirred for 4 hours, followed by cooling the reaction solution to room temperature.

To the cooled reaction solution, add 0.09 mol (8.8 g) of phosphoric acid and 165 g of deionized water for neutralization, stand still to allow layer separation, wherein the upper layer contains the solution and the lower layer contains the precipitate. Remove liquid solution other than the precipitate, further add 330 g of deionized water, stir, and remove liquid solution other than the precipitate again to complete the first washing cycle. Repeat the washing cycle for three times, and finally distill under reduced pressure to remove the solvent and obtain the product, which has the structure below.

Synthesis Example 3: Preparation of Flame Retardant a

Mix 216 g of DOPO, 90 g of dichloro-p-xylene and 1200 g of 1,2-dichlorobenzene. Stir and heat the resulting mixture under nitrogen atmosphere at 160° C. to proceed with reaction for 24 hours, followed by cooling to room temperature, filtering, baking and drying under vacuum at 120° C. for 6 hours, thereby obtaining Flame Retardant A as shown below as white powder, wherein the phosphorous content of Flame Retardant A is about 11%.

Figure 2:
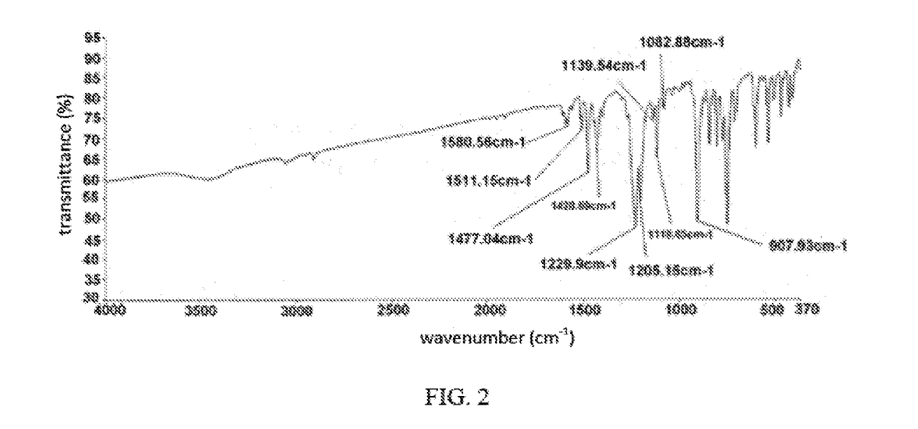
FIG. 2 illustrates the Fourier transform infrared spectroscopy (FTIR) result of Flame Retardant A obtained by Synthesis Example 3.

Use Fourier transform infrared spectroscopy (FTIR) analysis to characterize Flame Retardant A, and the result is shown in FIG. 2, wherein the FTIR absorption peak appears at 1594 cm$^{-1}$ (P-Ph), 1205 cm$^{-1}$ (P=O) and 908 cm$^{-1}$ (P—O-Ph); the FTIR result indicates the product thus obtained is Flame Retardant A illustrated above.

Example: Property Analysis

1. Prepregs were Made Using the Resin Compositions Enumerated in Table 1 to 3.

Resin compositions of E1 to E14 and C1 to C17 were well mixed in a stirred tank individually and then placed in an impregnation tank, and fiberglass fabrics (2116 E-glass fiber fabric, available from Nan Ya Plastics Corp.) were individually passed through the impregnation tank to impregnate the fiberglass fabrics with the resin compositions, followed by heating and baking at 150° C. to a semi-cured state to obtain prepregs. The thickness of each prepreg is 0.127 mm, and the resin content of each prepreg is about 55%.

2. Copper-Free Laminate Preparation (1) Copper-Free Laminates (Four-Layer)

Two 18 μm thickness copper foils and four aforesaid prepregs. The four prepregs were superimposed and placed between the two copper foils and subject to a lamination process under vacuum at 210° C. for 2 hours to form a copper clad laminate (CCL), in which the four prepregs were cured to form the insulation layers between the two copper foils. The resin content of the insulation layers is about 55%.

Each copper clad laminate was etched to remove the copper foils at both sides and obtain a copper-free laminate (four-layer), which comprises four prepregs laminated together and has a resin content of about 55%.

(2) Copper-Free Laminates (Two-Layer)

Two 18 μm thickness copper foils and two aforesaid prepregs. The two prepregs were superimposed and placed between the two copper foils and subject to a lamination process under vacuum at 210° C. for 2 hours to form a copper clad laminate (two-layer).

Next, each copper clad laminate was etched to remove the copper foils at both sides to obtain a copper-free laminate (two-layer), which comprises two prepregs laminated together and has a resin content of about 55%.

3. Test Methods and Property Measurements were Performed Pursuant to the Following Procedures.

(1) Thermal Expansion

In the thermal expansion test, the aforesaid copper-free laminate (four-layer) is used as the specimen. The specimen is heated from 50° C. to 260° C. so as to measure the dimensional expansion represented in % of each specimen using a thermal mechanical analyzer (TMA) by reference to the procedure described in IPC-TM-650 2.4.24.5, wherein lower percentage is more preferred.

(2) Thermal Resistance T288

In the thermal resistance test, the aforesaid copper clad laminate (four-layer, 6.5 mm×6.5 mm) is used as the specimen, and a thermal mechanical analyzer is used to measure the time to delamination of the copper clad laminate at a constant temperature 288° C. by reference to the procedure described in IPC-TM-650 2.4.24.1. Longer time to delamination represents higher thermal resistance of the copper clad laminate made from the resin composition.

(3) Dielectric Constant and Dissipation Factor

In dielectric constant and dissipation factor measurements, the aforesaid copper-free laminate (two-layer) is used as the specimen. A microwave dielectrometer commercially available from AET Inc. is used by reference to the procedure described in JIS C2565 to measure dielectric constant and dissipation factor under room temperature at 10 GHz frequency. Lower dielectric constant and lower dissipation factor represent a better dielectric property of the specimen. A difference less than 0.05 in Dk indicates no significant difference in dielectric constant of laminates, and a difference greater than 0.05 in Dk indicates significant difference in dielectric constant of laminates. A difference less than 0.0005 in Df indicates no significant difference in dissipation factor of laminates, and a difference greater than 0.0005 in Df indicates significant difference in dissipation factor of laminates.

(4) Flame Retardancy

In the flame retardancy test, the aforesaid copper-free laminate (four-layer, 125 mm×13 mm) is used as the specimen, and the test is performed by reference to the UL94 standard. The flame retardancy result is expressed as V-0, V-1, and V-2 levels, wherein V-0 represents a flame retardancy superior to V-1, V-1 is superior to V-2, and burn out represents the worst flame retardancy.

(5) Glass Transition Temperature (Tg)

In the glass transition temperature test, the aforesaid copper-free laminate (four-layer) is used as the specimen, which is tested by a dynamic thermomechanical analyzer (DMA) by reference to the procedure described in IPC-TM-650 2.4.24.4.

(6) Solder Dipping Thermal Resistance (S/D)

In the solder dipping test, the aforesaid copper clad laminate (four-layer) is used as the specimen, which is subject to tests and measurements by reference to the procedure described in IPC-TM-650 2.4.23, and the number of cycles to delamination of each specimen is recorded.

4. Results

Comparing E1 with C1 and C4 and E2 with C6, it can be observed that using the fluorenylidene-diphenol-modified polyphenylene oxide resin of the present disclosure achieves better laminate thermal expansion, T288 thermal resistance and dielectric loss.

Comparing E1 with C2 and C3, it can be observed that using the fluorenylidene-diphenol-modified polyphenylene oxide resin of the present disclosure in conjunction with Flame Retardant A of the present disclosure, the laminate may achieve excellent thermal resistance (Tg, T288, S/D), lower thermal expansion, as well as lower dielectric constant (Dk) and dissipation factor (Df) altogether.

Comparison between E1 and C1 shows that the fluorenylidene-diphenol-modified polyphenylene oxide resin synthesized in the present disclosure, compared with conventional vinylbenzyl polyphenylene oxide, may achieve better thermal resistance (Tg, T288), flame retardancy, thermal expansion and dielectric property. Comparison between E1 and C4 and between E2 and E6 shows that the fluorenylidene-diphenol-modified polyphenylene oxide resin synthesized in the present disclosure, compared with conventional methacrylate polyphenylene oxide resin, may achieve better T288 thermal resistance and lower (i.e. better) thermal expansion and dissipation factor.

The experimental data indicates that 100 parts by weight of the fluorenylidene-diphenol-modified polyphenylene oxide resin used in conjunction with 15 to 80 parts by weight of Flame Retardant A ensures better thermal resistance (Tg, T288, S/D), thermal expansion, dielectric property (Dk, Df), and V-0 flame retardancy of the laminate. While out of range, dissipation factor is worse (C7), and thermal expansion and T288 thermal resistance are worse (C8). In C2 to C3 and C9 to C11, another flame retardant is used, such that the laminate cannot ensure better thermal resistance, thermal expansion, dielectric property and flame retardancy at the same time (in C2, C9 and C10, thermal resistance, thermal expansion and flame retardancy become worse; in C3 and C11, thermal resistance, dielectric property and flame retardancy become worse).

TABLE 1

| Component | Type | Example | E1 | E2 | C1 | C2 | C3 | C4 | C5 | C6 |
|---|---|---|---|---|---|---|---|---|---|---|
| flame retardant | High melting point phosphorous-containing flame retardant | Flame Retardant A | 25 | 25 | 25 | | | 25 | | 25 |
| | Low melting point phosphorous-containing flame retardant | SPB-100 | | | | | | | 25 | |
| | Condensed phosphate | PX-202 | | | | 25 | | | | |
| | Hydroxy-containing phosphorous flame retardant | XZ92741 | | | | | 25 | | | |
| vinyl compound | fluorenylidene-diphenol-modified vinylbenzyl ether polyphenylene oxide | Compound A | 100 | 100 | | 100 | 100 | | | |
| | methacrylate polyphenylene oxide | SA-9000 | | | | | | 100 | 100 | 100 |
| | vinylbenzyl polyphenylene oxide | OPE-2st 2200 | | | 100 | | | | | |
| | bismaleimide | BMI-70 | | 30 | | | | | | 30 |
| peroxide | peroxide | 25B | 1 | 1 | 1 | 1 | 1 | 1 | 1 | 1 |
| inorganic filler | silica | SC-2050 SV | 70 | 70 | 70 | 70 | 70 | 70 | 70 | 70 |
| solvent | toluene | | 50 | 50 | 50 | 50 | 50 | 50 | 50 | 50 |
| | butanone | | 30 | 30 | 30 | 30 | 30 | 30 | 30 | 30 |

TABLE 2

| Component | Type | Example | E3 | E4 | E5 | E6 | E7 | E8 | E9 | E10 | E11 | E12 | E13 | E14 |
|---|---|---|---|---|---|---|---|---|---|---|---|---|---|---|
| flame retardant | High melting point phosphorous-containing flame retardant | Flame Retardant A | 25 | 35 | 35 | 35 | 40 | 25 | 35 | 35 | 80 | 15 | 45 | 45 |
| | Low melting point phosphorous-containing flame retardant | SPB-100 | | | | | | | | | | | | |
| | Condensed phosphate | PX-202 | | | | | | | | | | | | |
| | Hydroxy-containing phosphorous flame retardant | XZ92741 | | | | | | | | | | | | |
| vinyl compound | fluorenylidene-diphenol-modified vinylbenzyl ether polyphenylene oxide | Compound A | 100 | 100 | 100 | 100 | 100 | 100 | 100 | 100 | 100 | 100 | 100 | 100 |

TABLE 2-continued

| Component | Type | Example | E3 | E4 | E5 | E6 | E7 | E8 | E9 | E10 | E11 | E12 | E13 | E14 |
|---|---|---|---|---|---|---|---|---|---|---|---|---|---|---|
| | Liquid state ethylene-propylene-diene monomer rubber (EPDM) | trilene 67 | | 5 | 5 | 5 | 5 | | | | | | 5 | 5 |
| | butadiene-styrene copolymer | Ricon100 | | | 30 | 30 | 50 | 20 | 15 | 15 | | | | 20 |
| | butadiene-styrene copolymer | D-1118 | | | 10 | 10 | | 5 | | | | | 5 | 5 |
| | bismaleimide | BMI-70 | | | | 30 | | 50 | 15 | | | | 14 | 14 |
| peroxide | peroxide | 25B | 1 | 1 | 1 | 1 | 1 | 1 | 1 | 1 | 1 | 1 | 1 | 1 |
| inorganic filler | silica | SC-2050 SV | 70 | 70 | 70 | 70 | 70 | 70 | 70 | 70 | 70 | 70 | 70 | 70 |
| solvent | toluene | | 100 | 100 | 100 | 100 | 100 | 100 | 100 | 100 | 100 | 100 | 100 | 100 |
| | butanone | | 30 | 30 | 30 | 30 | 30 | 30 | 30 | 30 | 30 | 30 | 30 | 30 |

TABLE 3

| Component | Type | Example | C7 | C8 | C9 | C10 | C11 |
|---|---|---|---|---|---|---|---|
| flame retardant | High melting point phosphorous-containing flame retardant | Flame Retardant A | 90 | 10 | | | |
| | Low melting point phosphorous-containing flame retardant | SPB-100 | | | 60 | | |
| | Condensed phosphate | PX-202 | | | | 60 | |
| | Hydroxy-containing phosphorous flame retardant | XZ92741 | | | | | 60 |
| vinyl compound | fluorenylidene-diphenol-modified vinylbenzyl ether polyphenylene oxide | Compound A | 100 | 100 | 100 | 100 | 100 |
| | Liquid state ethylene-propylene-diene monomer rubber (EPDM) | trilene 67 | 5 | | 5 | 5 | 5 |
| | butadiene-styrene copolymer | Ricon100 | | | | | |
| | butadiene-styrene copolymer | D-1118 | 7.5 | | 5 | 5 | 5 |
| | bismaleimide | BMI-70 | 35 | | 35 | 35 | 35 |
| peroxide | peroxide | 25B | 1 | 1 | 1 | 1 | 1 |
| inorganic filler | silica | SC-2050 SV | 70 | 70 | 70 | 70 | 70 |
| solvent | toluene | | 100 | 100 | 100 | 100 | 100 |
| | butanone | | 30 | 30 | 30 | 30 | 30 |

TABLE 4

| Laminate property | Test item (method) | Unit | E1 | E2 | C1 | C2 | C3 | C4 | C5 | C6 |
|---|---|---|---|---|---|---|---|---|---|---|
| Glass transition temperature | Tg (DMA) | ° C. | 205 | 210 | 190 | 176 | 194 | 209 | 194 | 210 |
| Thermal expansion | Dimensional change (TMA) | % | 1.95 | 1.75 | 3.04 | 3.35 | 2.72 | 2.33 | 3.03 | 2.31 |
| 288° C. thermal resistance | T288 (TMA) | minute | >70 | >70 | 55 | 30 | 15 | 63 | 60 | 68 |
| Solder dipping thermal resistance | S/D | cycle | >20 | >20 | >20 | 15 | 8 | >20 | >20 | >20 |
| Dielectric constant | Dk@10 GHz | NA | 3.51 | 3.51 | 3.6 | 3.6 | 3.7 | 3.5 | 3.5 | 3.5 |
| Dissipation factor | Df@10 GHz | NA | 0.0052 | 0.0055 | 0.0060 | 0.0056 | 0.0114 | 0.0066 | 0.0066 | 0.0067 |
| Flame retardancy | UL94 | NA | V-0 | V-0 | V-1 | V-2 | V-1 | V-0 | V-0 | V-0 |

TABLE 5

| Laminate property | Test item (method) | Unit | E3 | E4 | E5 | E6 | E7 | E8 |
|---|---|---|---|---|---|---|---|---|
| Glass transition temperature | Tg (DMA) | ° C. | 202 | 205 | 199 | 216 | 196 | 190 |
| Thermal expansion | Dimensional change (TMA) | % | 2.05 | 2.39 | 2.43 | 1.83 | 2.77 | 2.45 |
| 288° C. thermal resistance | T288 (TMA) | minute | >70 | >70 | >70 | >70 | >70 | >70 |
| Solder dipping thermal resistance | S/D | cycle | >20 | >20 | >20 | >20 | >20 | >20 |
| Dielectric constant | Dk@10 GHz | NA | 3.48 | 3.47 | 3.48 | 3.57 | 3.55 | 3.56 |
| Dissipation factor | Df@10 GHz | NA | 0.0050 | 0.0044 | 0.0046 | 0.0054 | 0.0043 | 0.0056 |
| Flame retardancy | UL94 | NA | V-0 | V-0 | V-0 | V-0 | V-0 | V-0 |

| Laminate property | Test item (method) | Unit | E9 | E10 | E11 | E12 | E13 | E14 |
|---|---|---|---|---|---|---|---|---|
| Glass transition temperature | Tg (DMA) | ° C. | 237 | 213 | 207 | 199 | 216 | 218 |
| Thermal expansion | Dimensional change (TMA) | % | 1.85 | 1.97 | 2.6 | 2.5 | 1.9 | 1.99 |
| 288° C. thermal resistance | T288 (TMA) | minute | >70 | >70 | >70 | >70 | >70 | >70 |
| Solder dipping thermal resistance | S/D | cycle | >20 | >20 | >20 | >20 | >20 | >20 |
| Dielectric constant | Dk@10 GHz | NA | 3.6 | 3.59 | 3.7 | 3.52 | 3.47 | 3.47 |
| Dissipation factor | Df@10 GHz | NA | 0.0059 | 0.0058 | 0.0059 | 0.0053 | 0.0046 | 0.0045 |
| Flame retardancy | UL94 | NA | V-0 | V-0 | V-0 | V-0 | V-0 | V-0 |

TABLE 6

| Laminate property | Test item (method) | Unit | C7 | C8 | C9 | C10 | C11 | C12 |
|---|---|---|---|---|---|---|---|---|
| Glass transition temperature | Tg (DMA) | ° C. | 217 | 192 | 189 | 185 | 193 | 152 |
| Thermal expansion | Dimensional change (TMA) | % | 1.8 | 3 | 3.54 | 3.49 | 2.71 | 3.69 |
| 288° C. thermal resistance | T288 (TMA) | minute | >70 | 64 | 64 | 30 | 15 | 15 |
| Solder dipping thermal resistance | S/D | cycle | >20 | >20 | >20 | >20 | 15 | 15 |
| Dielectric constant | Dk@10 GHz | NA | 3.77 | 3.58 | 3.67 | 3.65 | 4.1 | 3.3 |
| Dissipation factor | Df@10 GHz | NA | 0.006 | 0.0052 | 0.0061 | 0.0058 | 0.0123 | 0.005 |
| Flame retardancy | UL94 | NA | V-0 | Burn out | V-2 | Burn out | V-1 | V-0 |

| Laminate property | Test item (method) | Unit | C13 | C14 | C15 | C16 | C17 |
|---|---|---|---|---|---|---|---|
| Glass transition temperature | Tg (DMA) | ° C. | 202 | 179 | 183 | 216 | 189 |

TABLE 6-continued

| Thermal expansion | Dimensional change (TMA) | % | 2.14 | 2.87 | 2.25 | 1.56 | 2.74 |
|---|---|---|---|---|---|---|---|
| 288° C. thermal resistance | T288 (TMA) | minute | 50 | 55 | 58 | >70 | 57 |
| Solder dipping thermal resistance | S/D | cycle | >20 | >20 | >20 | >20 | >20 |
| Dielectric constant | Dk@10 GHz | NA | 3.5 | 3.7 | 3.5 | 3.7 | 3.6 |
| Dissipation factor | Df@10 GHz | NA | 0.006 | 0.0059 | 0.0059 | 0.0061 | 0.0059 |
| Flame retardancy | UL94 | NA | V-0 | V-0 | V-0 | V-0 | V-0 |

What is claimed is:

1. A fluorenylidene-diphenol-modified polyphenylene oxide, having any one of the following formulae:

wherein X is selected from:

and a combination thereof, and each $R_{24}$ is individually selected from a C1 to C4 alkylene;

Y is selected from:

wherein A is a covalent bond, —$CH_2$—, —$CH(CH_3)$—, —$C(CH_3)_2$—, —O—, —S—, —$SO_2$— or a carbonyl group; m and n are the same or different positive integers; $R_1$-$R_{16}$ are individually selected from hydrogen and a C1 to C4 alkyl;

Z is selected from:

and a combination thereof, wherein $R_{17}$ through $R_n$ are individually hydrogen or a C1 to C4 alkyl; Q and W are individually an aliphatic group;

D is selected from:

and a combination thereof, wherein R is hydrogen or a covalent bond; and b is a positive integer of 1 to 20.

2. The fluorenylidene-diphenol-modified polyphenylene oxide of claim 1, wherein each $R_{24}$ is methylene, and X is

3. The fluorenylidene-diphenol-modified polyphenylene oxide of claim 1, wherein:

in Y, $R_2, R_3, R_7, R_8, R_{10}, R_{11}, R_{15}$ and $R_{16}$ are individually methyl, $R_1, R_4, R_5, R_6, R_9, R_{12}, R_{13}$ and $R_{14}$ are individually hydrogen, and A is —C(CH$_3$)$_2$—; or $R_1, R_2, R_3, R_6, R_7, R_8, R_{10}, R_{11}, R_{15}$ and $R_{16}$ are individually methyl, $R_4, R_5, R_9, R_{12}, R_{13}$ and $R_{14}$ are individually hydrogen, and A is a covalent bond; and m and n are individually a positive integer of 1 to 30.

4. The fluorenylidene-diphenol-modified polyphenylene oxide of claim 1, wherein Z is 2-propenyl or

5. The fluorenylidene-diphenol-modified polyphenylene oxide of claim 1, wherein D is

6. The fluorenylidene-diphenol-modified polyphenylene oxide of claim 1, wherein b is a positive integer of 1 to 5.

7. The fluorenylidene-diphenol-modified polyphenylene oxide of claim 1, having any one or more of the following structures:

wherein m and n are individually an integer of 1 to 10.

8. A resin composition, comprising:
   100 parts by weight of the fluorenylidene-diphenol-modified polyphenylene oxide of claim 1; and
   15 to 80 parts by weight of a flame retardant having the following structure:

9. The resin composition of claim 8, further comprising a vinyl compound, a vinyl polymer or both.

10. The resin composition of claim 9, wherein the vinyl compound or the vinyl polymer is selected from ethylene-propylene-diene monomer rubber, butadiene-styrene copolymer, bismaleimide and a combination thereof.

11. A product made from the resin composition of claim 8, comprising a resin film, a prepreg, a laminate or a printed circuit board.

* * * * *